United States Patent [19]
Asaka et al.

[11] Patent Number: 5,689,469
[45] Date of Patent: Nov. 18, 1997

[54] SEMICONDUCTOR MEMORY DEVICES

[75] Inventors: Hideo Asaka; Hiroyuki Yamauchi, both of Osaka, Japan

[73] Assignee: Matsushita Electric Industrial Co., Ltd., Osaka, Japan

[21] Appl. No.: 742,537

[22] Filed: Nov. 1, 1996

Related U.S. Application Data

[62] Division of Ser. No. 420,875, Apr. 13, 1995, Pat. No. 5,594,701.

[30] Foreign Application Priority Data

Apr. 15, 1994 [JP] Japan .................................. 6-077513

[51] Int. Cl.$^6$ ...................................... G11C 7/00
[52] U.S. Cl. ................. 365/203; 365/230.06; 365/149
[58] Field of Search ............................. 365/203, 230.06, 365/189.06, 149

[56] References Cited

U.S. PATENT DOCUMENTS 5,373,479  12/1994  Noda ..................... 365/230.06
5,504,715   4/1996  Lee et al. ................ 365/230.06

*Primary Examiner*—David C. Nelms
*Assistant Examiner*—Huan Hoang
*Attorney, Agent, or Firm*—McDermott, Will & Emery

[57] ABSTRACT

Precharge circuits precharge plural pairs of bit lines to a specified potential when no word line is selected (during standby). Pull-down transistors are turned ON when the corresponding word lines are not selected so as to connect the corresponding word lines to a common power source line, which is connected to the ground. In a path connecting the above common power source line to the ground is disposed an impedance changing means for changing the impedance of the path between a value during standby and another value during operation during which any word line is selected so that the value during standby is set higher than the value during operation. Consequently, during standby, a leakage current (standby current) resulting from a short circuit between a bit line and a word line is reduced.

14 Claims, 14 Drawing Sheets

SEMICONDUCTOR MEMORY DEVICES

This is a divisional of application Ser. No. 08/420,875, filed Apr. 13, 1995, now U.S. Pat. No. 5,594,701.

BACKGROUND OF THE INVENTION

The present invention relates to improved semiconductor memory devices represented by a DRAM (dynamic random-access memory). More particularly, it relates to an improved semiconductor memory device in which an increase in leakage current resulting from a short circuit between a bit line and a word line during standby, i.e., an increase in power consumption during standby is restrained.

In general, semiconductor memory devices are provided with a large number of precharge circuits for precharging numerous pairs of bit lines to an intermediate potential between a power-source potential and the ground potential, so that during standby, the pairs of bit lines are precharged by the above precharge circuits to the intermediate potential, while a word line is grounded. If there occurs a short circuit between any of the bit lines and the above word line during standby, a large leakage current is allowed to flow from the short-circuited bit line to the ground potential via the word line. The leakage current is termed a standby current, which significantly reduces the production yield of semiconductor memory devices. In a semiconductor memory device driven by batteries, in particular, the leakage current may cause a reduction in lifetime of the batteries.

To reduce the standby current, there can be devised an arrangement in which a large number of precharge circuits are provided with their respective fuses. If a word line and a bit line are short-circuited, the fuse of the precharge circuit corresponding to the defective pair of bit lines may be melted for disconnection so that the defective pair of bit lines are not precharged to the intermediate potential. However, since each of the precharge circuits is disposed between two bit lines forming a pair and a sense amplifier and like elements are placed around them, it is spatially difficult to dispose a fuse in or around each of the precharge circuits. To overcome the difficulty, there has conventionally been proposed a semiconductor memory device in which a plurality of precharge power-source lines are assigned individually to a plurality of precharge circuits and fuses are disposed in the respective precharge power-source lines. There has been disclosed a prior art which uses the above method to reduce the leakage current in a DRAM on standby (ISSCC DIGEST OF TECHNICAL PAPERS 93 (1993), pp.48–49).

The prior art is shown in FIGS. 11 and 12, in which a plurality of memory cell blocks 500 ... are formed (in FIG. 12, only one memory cell block is shown) by dividing a single memory cell array, while sense amplifier blocks 700 ... are disposed on one side of the corresponding memory cell blocks 500 ... In each of the sense amplifier blocks 700 ..., precharge circuits which are equal in number to the pairs of bit lines in the corresponding memory cell block 500 are provided in the direction in which the bit lines extend so that each of the precharge circuits precharges the corresponding pair of bit lines to a specified potential. In addition, as a redundant substitution system in case of a short circuit between a bit line and a word line, there are provided redundant memory cell blocks 600 and redundant sense amplifier blocks 800 (only one redundant memory cell block and only one redundant sense amplifier block are shown in FIG. 12). The redundant sense amplifier blocks 800 are provided on one side of the corresponding redundant memory cell blocks 600. A pair of precharge power-source lines 650a and 650s are provided for each of the above regular precharge sense amplifier blocks 700 and for each of the redundant sense amplifier blocks 800. There is also provided a precharge potential supply line 670 for supplying a potential to the power-source lines 650a and 650s. Between each of the power-source lines 650a ... and the precharge potential supply line 670 are provided power switches 660a ... and 660s ... If any one bit line in any memory cell block 500 is short-circuited with a word line, the power switch 660a corresponding to the memory cell block 500 containing the defective bit line is disconnected so as to inhibit the precharging of the memory cell block 500 containing the defective bit line, thus preventing the flow of the leakage current. On the other hand, the power switch 660s corresponding to the redundant memory cell block 600 is closed so as to enable the precharging of the redundant memory cell block 600, thereby substituting the above memory cell block 500 containing the defective bit line with the redundant memory cell block 600.

However, the above prior art has the following drawback. That is, if any one bit line in any one memory cell block 500 is short-circuited with a word line, the power switch 660a for the precharge power-source line 650a corresponding to the memory cell block 500 is opened, with the result that the sense amplifier block 700 corresponding to the precharge power-source line 650a is not supplied with the precharge potential. Consequently, in the above memory cell block 500 containing the defective bit line, the majority of normal pairs of bit lines and word lines cannot be used until the whole memory cell block 500 is substituted with the redundant memory cell block 600. Therefore, it is necessary to design the redundant memory cell block 600 and the regular memory cell block 500 in equal size, which increases the chip area disadvantageously.

The present inventors have also found that, even if the above precharge power-source line 650a is opened with the power switch 660a, the standby current is allowed to flow from another power-source line to a ground line via the defective bit line and word line. The flow of the standby current is shown in FIG. 13.

In FIG. 13 are shown: two bit lines BL and BL/ forming a pair; a word line WL; a precharge circuit 800 consisting of three transistors for connecting the two bit lines BL and /BL; a precharge power-source line 810 for supplying a specified potential to the precharge circuit 800; an equalize signal line 820 for turning ON the three transistors of the above precharge circuit 800; a sense amplifier 850 consisting of two P-channel transistors TP connected in series for connecting the pair of bit lines BL and /BL and of two N-channel transistors TN connected in series for connecting the pair of bit lines BL and /BL, so that a common source line SP is connected to the connecting point between the above two P-channel transistors TP and another common source line SN is connected to the connecting point between the above two N-channel transistors TN; a common-source-line equalize circuit 860 consisting of three transistors for connecting the above two common source lines SP and SN and equalizing them to a power-source potential ½·Vcc; a potential supply circuit 870 for setting the common source line SP at a power-source potential Vcc and setting the common source line SN at the ground potential Vss; an equalize signal eq outputted to the common-source-line equalize circuit 860; and an inverted signal /eq of the above equalize signal eq, which is outputted to the potential supply circuit 870.

A description will be given to the operation of the above structure of FIG. 13 with reference to the individual signal waveforms shown in FIG. 14.

During the operation of precharging the pairs of bit lines, a signal EQ on the equalize signal line 820 is activated so as to precharge the bit lines BL and /BL to a specified potential (½·Vcc), while the equalize signal eq is activated so as to equalize the common source lines SP and SN to a specified potential (½·Vcc), thereby placing the sense amplifier 850 on standby. During the operation of amplifying the pair of bit lines BL and /BL, the signal EQ on the equalize signal line 820 and the equalize signal eq are inactivated, while the inverted signal /eq of the equalize signal eq are activated. As a result, a slight potential difference is caused between the pair of bit lines BL and /BL by the selected word line WL, which is detected and amplified by the sense amplifier 850.

With the above prior art shown in FIG. 13, if there is a short-circuit (represented by "R" in FIG. 13) between one bit line BL and a word line WL, for example, the potential on the above defective bit line BL becomes lower than the precharge potential ½·Vcc during the operation of precharging the pairs of bit lines. Accordingly, the slight potential difference is caused between the pair of bit lines BL and BL/, while the gate potential in the P-channel transistor TP positioned below the sense amplifier 850 becomes lower than the above precharge potential ½·Vcc. Consequently, if the gate-source potential in the P-channel transistor TP surpasses the threshold voltage thereof, the P-channel transistor TP is turned ON so that the standby current is allowed to flow from the common source line SP to the other bit line /BL via the above transistor TP on the lower position that has been turned ON. As a result, the N-channel transistor TN on the upper position is turned ON so that the standby current is allowed to flow from the power source of ½·Vcc toward the ground via the common-source-line equalize circuit 860, the transistor TN on the upper position that has been turned ON, the above defective bit line BL, and the word line WL.

SUMMARY OF THE INVENTION

A first object of the present invention is to reduce a standby current, while reducing the area occupied by a redundant memory cell block. A second object of the present invention is to eliminate the standby current resulting from a malfunction of a sense amplifier during the operation of precharging pairs of bit lines. A third object of the present invention is to reduce or eliminate the standby current by devising wiring for connecting a word line to the ground, in consideration of a short circuit between a word line and a bit line.

To attain the above objects, the present invention adopts a structure which permits redundant substitution using some of numerous pairs of bit lines as a unit, so that the normal pairs of bit lines other than one defective pair of bit lines are used as they are in one memory cell block, thereby preventing an increase in chip area.

The present invention also turns OFF a plurality of transistors constituting sense amplifiers during the operation of precharging the pairs of bit lines, thereby eliminating the standby current flowing via the sense amplifiers.

Moreover, the present invention sets the impedance between the word line and a ground line at a high value during the operation of precharging the pairs of bit lines, thereby reducing the value of the standby current.

That is, the semiconductor memory device of the present invention comprises: a plurality of memory cell blocks formed by dividing a cell array consisting of a large number of word lines and numerous pairs of bit lines intersecting the word lines into a plurality of sections in the direction in which the word lines extend; a plurality of sense amplifier blocks which are equal in number to the above memory cell blocks, each being disposed on one side of the corresponding memory cell block along the word lines; a plurality of column-select signal lines used in common by the above memory cell blocks; a plurality of precharge power-source lines which are equal in number to the above column-select signal lines; and a plurality of disconnecting means disposed in the above respective precharge power-source lines, wherein each of the above sense amplifier blocks has a plurality of precharge circuits for precharging the pairs of bit lines in the corresponding memory cell block to a specified potential, each one of the above column-select signal lines is provided based on specified ones of the pairs of bit lines provided in each of the memory cell blocks so as to select one pair of bit lines in each of the memory cell blocks simultaneously, the above individual precharge power-source lines supply the specified potential to the precharge circuits for the pairs of bit lines from which one pair can be selected by the corresponding column-select signal line, and one of the above column-select signal lines, the pairs of bit lines in each of the memory cell blocks which correspond to the column-select signal line, the precharge circuits in each of the sense amplifier blocks, and one of the precharge power-source lines constitute a unit for redundant substitution in case of a short circuit between a word line and a bit line.

Alternatively, the semiconductor memory device of the present invention comprises: a memory cell consisting of a capacitor and a transistor; a pair of bit lines onto which a signal is read from the above memory cell; a sense amplifier of flip-flop type which consists of a first transistor of the conductivity type opposite to that of the transistor of the above memory cell and a second transistor of the same conductivity type as that of the transistor of the above memory cell and which amplifies the signal read onto the above pair of bit lines; and two common source lines connected to the first and second transistors of the above sense amplifier, respectively, so as to supply a specified potential to the corresponding transistor, the above semiconductor memory device further comprising a potential supplying means for supplying, during a period during which the above sense amplifier is inactive, a potential for cutting off the above first transistor to the common source line connected to the first transistor of the conductivity type opposite to that of the transistor of the above memory cell, the above potential being either higher or lower than half the power-source potential of the semiconductor memory device, depending on the type of the first transistor.

Alternatively, the semiconductor memory device of the present invention comprises: a plurality of memory cells, each consisting of a capacitor and a transistor; a plurality of word lines for individually controlling the transistors of the above memory cells; plural pairs of bit lines onto which information accumulated in the capacitors of the above memory cells is read individually; a plurality of sense amplifiers for individually amplifying the information read onto the pairs of bit lines; a plurality of pull-down transistors which are equal in number to the above word lines, the above pull-down transistors connecting, if the corresponding word lines are not selected, the corresponding word lines to the ground; and precharge circuits for precharging, during standby during which no word line is selected, the above pairs of bit lines to a specified potential, the above semiconductor memory device further comprising a current limiting means for reducing, during standby, a current flowing from each of the word lines to the ground via the pull-down transistor.

In addition, in the above semiconductor memory device of the present invention, the current limiting means consists of: a common power source line to which the sources of the respective pull-down transistors are connected; and an impedance changing means disposed in a path connecting the above common power source line to the ground so as to change the impedance of the path between a value during standby and another value during operation during which any word line is selected, the value during standby being set higher than the value during operation.

Moreover, in the above semiconductor memory device of the present invention, the current limiting means consists of: a common power source line to which the sources of the respective pull-down transistors are connected; and a potential changing means for changing the potential on the above common power source line between a value during standby and another value during operation during which any word line is selected, the value during standby being set higher than the value during operation.

With the above structure, if a defect results from a short circuit between a bit line belonging to any memory cell block and a word line in the semiconductor memory device of the present invention, redundant substitution is performed using, as a unit, the column-select signal line for selecting the defective bit line, a plurality of bit lines corresponding to the column-select signal line (including the defective bit line), a plurality of precharge circuits corresponding to the above column-select signal line, and a single precharge power-source line.

Since the above unit for redundant substitution is based on the plural pairs of bit lines from which one pair can be selected by one column-select signal line, it coincides with a unit for substitution in case of a bit failure (a defective connection among a memory cell, a bit line, and a word line), so that, compared with the conventional case wherein a whole memory cell block is redundantly substituted, the area occupied by the unit for redundant substitution can be reduced.

In the semiconductor memory device of the present invention, if there is a bit-line/word-line short circuit, those ones of transistors constituting the sense amplifiers which are of the conductivity type opposite to that of the transistors in the memory cell are susceptible to a malfunction. However, since the malfunction of the transistors is surely prevented by the potential supplying means, the standby current which uses, as a power source, the common source line for the sense amplifiers is surely prevented from flowing from the sense amplifier to the ground via the defective bit line and word line.

Moreover, in the semiconductor memory device of the present invention, the impedance between the word line and the ground is variably set by the impedance changing means so that, during standby (during the operation of precharging the pairs of bit lines), the impedance between the word line and the ground is set to a high value, thereby reducing the standby current flowing from the defective bit line to the ground via the word line.

Furthermore, in the semiconductor memory device of the present invention, although the bit lines are precharged to a specified potential during standby (during the operation of precharging the bit lines), the potential on the word line is increased to a value higher than the value during standby. As a result, the potential difference between the above bit line and word line is reduced so that the standby current flowing from the bit line to the ground via the word line is effectively reduced.

The above objects and novel features of the present invention will be more apparent from the reading of the following description in conjunction with the accompanying drawings.

BRIEF DESCRIPTION OF THE DRAWINGS

The accompanying drawings illustrate the preferred embodiments of the present invention.

In the drawings.

DETAILED DESCRIPTION OF THE PREFERRED EMBODIMENTS

Below, the preferred embodiments of a semiconductor memory device according to the present invention will be described with reference to the accompanying drawings.

(First Embodiment)

Figure 1:
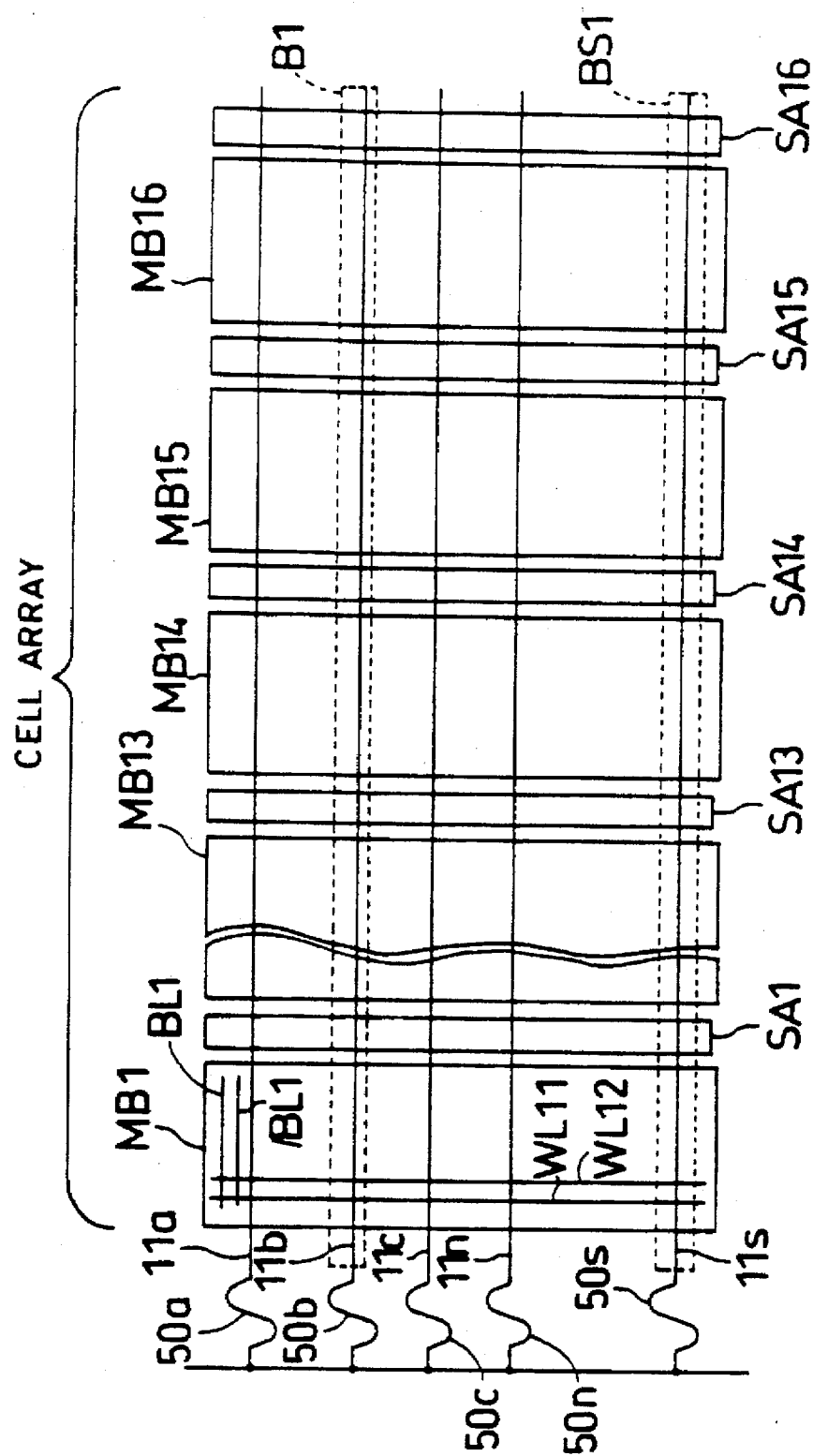
FIG. 1 is a view showing the overall structure of a semiconductor memory device according to a first embodiment of the present invention.
Figure 2:
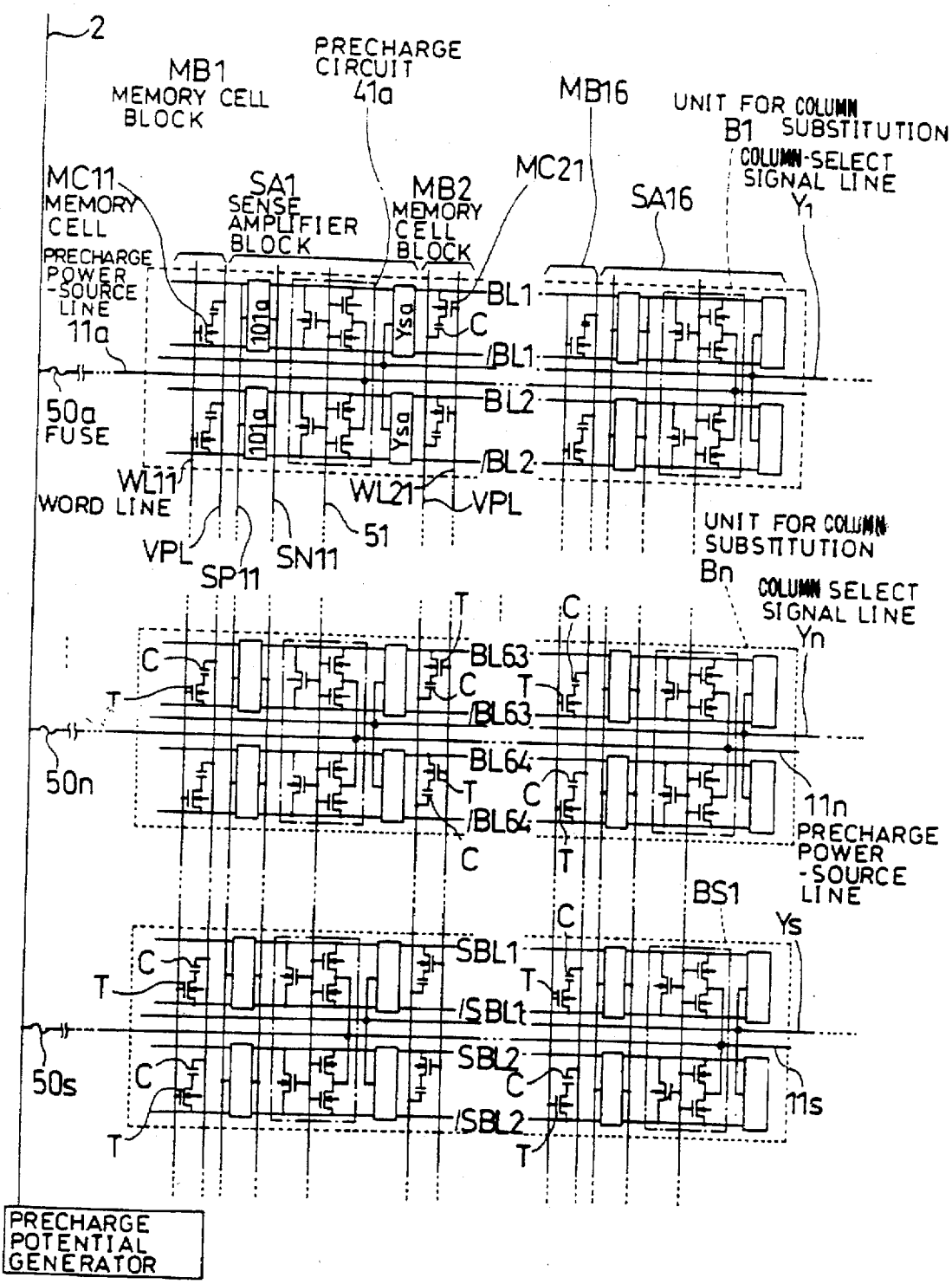
FIG. 2 is a view specifically showing the structure of a principal portion of the semiconductor memory device according to the first embodiment of the present invention.
Figure 3:
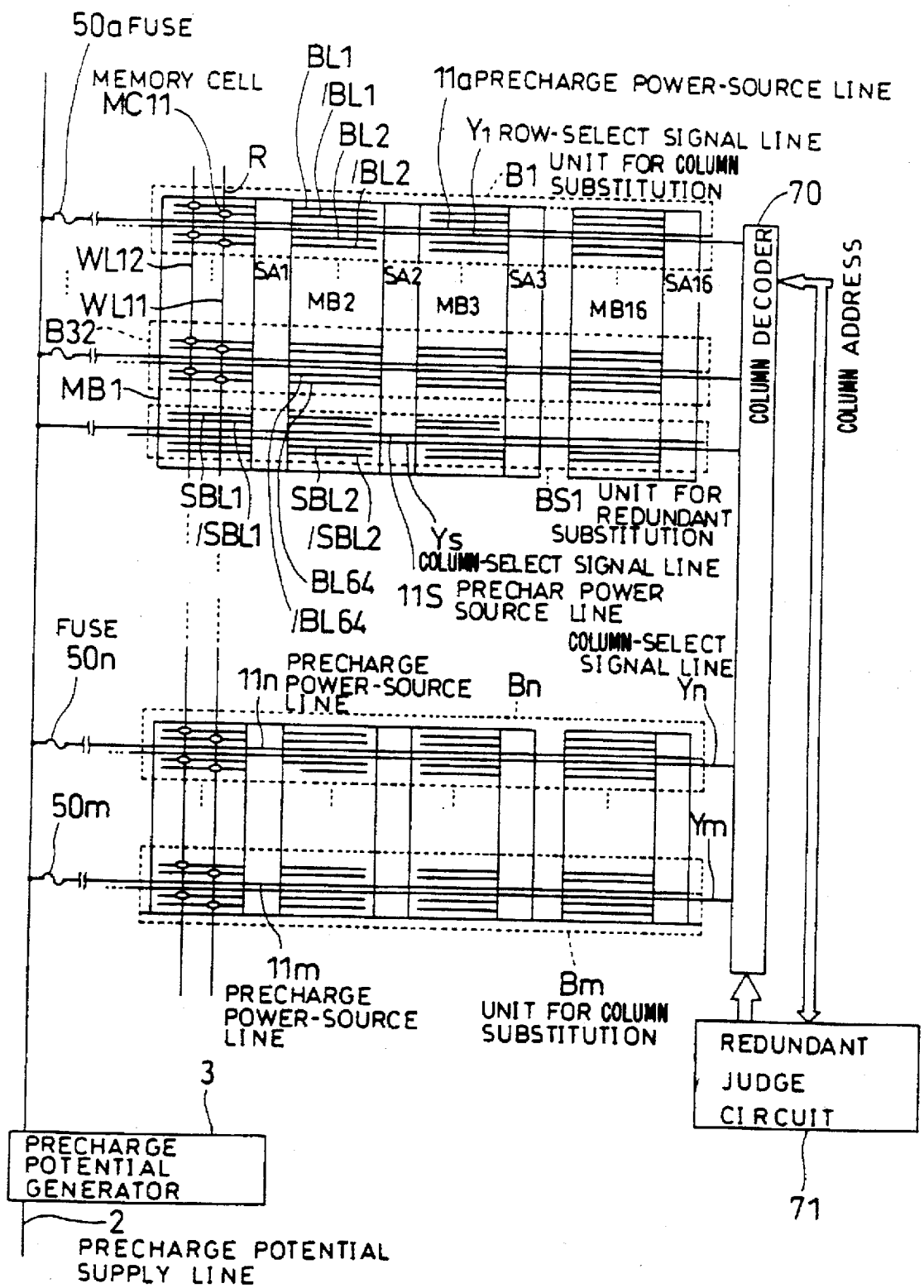
FIG. 3 is a view schematically showing the structure of a memory cell array according to the first embodiment of the present invention.

FIGS. 1 to 3 show circuit diagrams in each of which a semiconductor memory device according to a first embodiment of the present invention is applied to a 16-Mbit DRAM.

The 16-Mbit cell array is halved both in the direction of columns and in the direction of rows so that it is eventually divided into four sections. FIGS. 1 to 3 are the respective circuit diagrams of the four sections. The circuit in each section is further divided into 16 subsections in the direction of rows. In the direction of columns, the circuit in one of 16 subsections has 512 pairs of regular bit lines and plural pairs of redundant bit lines for faulty bits. In the direction of rows, the circuit in one of 16 subsections has 256 regular word lines and a plurality of redundant word lines for bit faults.

In FIGS. 1 to 3 is shown a cell array 1 having numerous pairs of bit lines BL1 and /BL1 . . . and a large number of word lines WL1 . . . which are perpendicular to the bit lines.

In the drawings are also shown: a plurality of memory cell blocks MB1 to MB16 obtained by dividing the above cell array 1 into 16 sections in the direction in which the above word lines WL1 . . . extend; and sense amplifier blocks SA1 . . . SA16 which are equal in number to the plurality of memory cell blocks, each of which is disposed on one side of the corresponding memory cell block along the word lines.

In the drawings are also shown: row substitution units B1, Bn . . . which are formed by dividing each of the above memory cell blocks MB1 . . . into parts by every two pairs of bit lines; and a redundant substitution unit BS1 which is equal in size to each of the above column substitution units B1 . . . The column substitution unit B1 includes memory cells MC11, MC21 . . . , each of which consists of a capacitor C and an N-type transistor T.

In the drawings are also shown a plurality of column-select signal lines Y1 . . . Yn . . . and Ys used in common by the above memory cell blocks MB1 . . . The column-select signal lines Y1 . . . extend in the direction in which the pairs of bit lines BL1 and /BL1 . . . extend. One column-select signal line is provided for each of the column substitution units B1, Bn, . . . and redundant substitution unit BS1.

Each of the above sense amplifier blocks SA1 . . . consists of: a plurality of precharge circuits 41a . . . for precharging four bit lines BL1, /BL1, BL2, and /BL2 which extend in the direction of columns to a reference potential (e.g., ½·VCC); an equalize signal line 51; a plurality of sense amplifiers 101a; two common source lines SN11 and SP11 connected to each of the sense amplifiers; and two column select circuits Ysa connected to the corresponding column-select signal lines Y1 . . .

Consequently, as enclosed by the rectangles of broken lines in FIG. 2, each of the above column substitute units B1 . . . and redundant substitute unit BS1 serve as a unit for substituting, in case any bit line is short-circuited, a plurality of (thirty two) memory cell blocks arranged in the direction of columns, each of which has been formed on the basis of the four adjacent bit lines extending in the direction of columns.

In addition, there are also shown precharge power-source lines 11a . . . 11n . . . , and 11s, which are equal in number to the above column-select signal lines Y1 . . . Each of the precharge power-source lines 11a . . . extends in parallel with the above column-select signal lines Y1 . . .

In FIGS. 1 and 2 are also shown: a precharge potential generator (precharge potential supply circuit) 3 for generating a precharge potential for the pairs of bit lines; and a precharge potential supply line 2 connected to the above precharge potential generator 3. To the precharge potential supply line 2 is connected each of the above precharge power-source lines 11a . . . 11n . . . , and 11s. In the above precharge power-source lines 11a . . . 11n . . . , and 11s are disposed fuses (disconnecting means) 50a . . . 50n . . . , and 50s around their connecting points with the precharge potential supply line 2. Each of the fuses 50a . . . 50n . . . , and 50s is 1 to 20 μm in size.

Moreover, in FIG. 3 is shown: a column decoder 70 for selecting one from the column-select signal lines Y1 . . . Yn, Ym . . . , and Ys that corresponds to the received column address; and a redundant judge circuit 71 for converting, after a defect substitution unit B1 is substituted by the redundant substitution unit BS1, if the substitution unit corresponding to the received column address is the defective column that has been subjected to the redundant substitution described above, the received column address to a redundant column address.

Thus, in the present embodiment, if there occurs a short-circuit (represented by the resistant component R) between, e.g., the bit line BL1 and the word line WL11 as shown in FIG. 3, the fuse 50a connected to the precharge power-source line 11a is disconnected, so that the precharge circuit 41a is not supplied with the precharge potential from the precharge potential generator 3. Therefore, the defective pair of bit lines (BL1 and /BL1) are not precharged, so that the standby current is not allowed to flow to the ground via the defective bit line and word line during the operation of precharging the pairs of bit lines (during standby).

In this case, the column recorder 70 receives the redundant column address from the redundant judge circuit 71 and selects the column-select signal line Ys for selecting the redundant bit lines SBL1 and SBL1 or SBL2 and /SBL2 instead of the column-select signal line Y1, so that data is read and written from and in a redundant memory cell through the redundant bit lines SBL1 and SBL1 or SBL2 and /SBL2 in the redundant substitution unit BS1.

The redundant substitution unit BS1 has 32 sense amplifiers 101a in total, which are arranged in a matrix of 16 in the direction in which the bit lines extend by 2 in the direction in which the word lines extend. Consequently, compared with the case wherein that 4-Mbit portion of the circuit (circuit of FIG. 2) which comprises 512 sense amplifiers in the direction in which the word lines extend is used as a unit for substitution, the area occupied by the redundant substitution unit can be reduced to about 1/16 in the present embodiment.

Moreover, since each of the fuses 50a . . . is 1 to 20 μm in size, even when the fuses 50a . . . are disposed in a peripheral circuit outside the memory cell array, they are dimensionally negligible if they are used with a DRAM chip having a length of 1.5 cm, so that the chip can be miniaturized satisfactorily. Furthermore, since the fuses 50a . . . are disposed on the more spacious side of the cell array, their placement becomes easier.

Although a single redundant column is provided in the present embodiment, it will easily be appreciated that a plurality of redundant columns may be provided instead.

Although the fuses 50a are used as disconnecting means in the present embodiment, keying circuits may be used instead. In this case, if the precharge power-source line 11s is disconnected from the precharge potential generator 3 so as not to precharge a redundant pair of bit lines which have not yet been used for redundant substitution, a further reduction can be achieved in power consumption.

Although the redundant substitution unit BS1 is used in case of a short circuit between a bit line and a word line, if the redundant substitution unit BS1 is used extensively in another failure mode, further chip miniaturization can be pursued along with a reduction in the area occupied by the redundant substitution unit.

(Second Embodiment)

Figure 4:
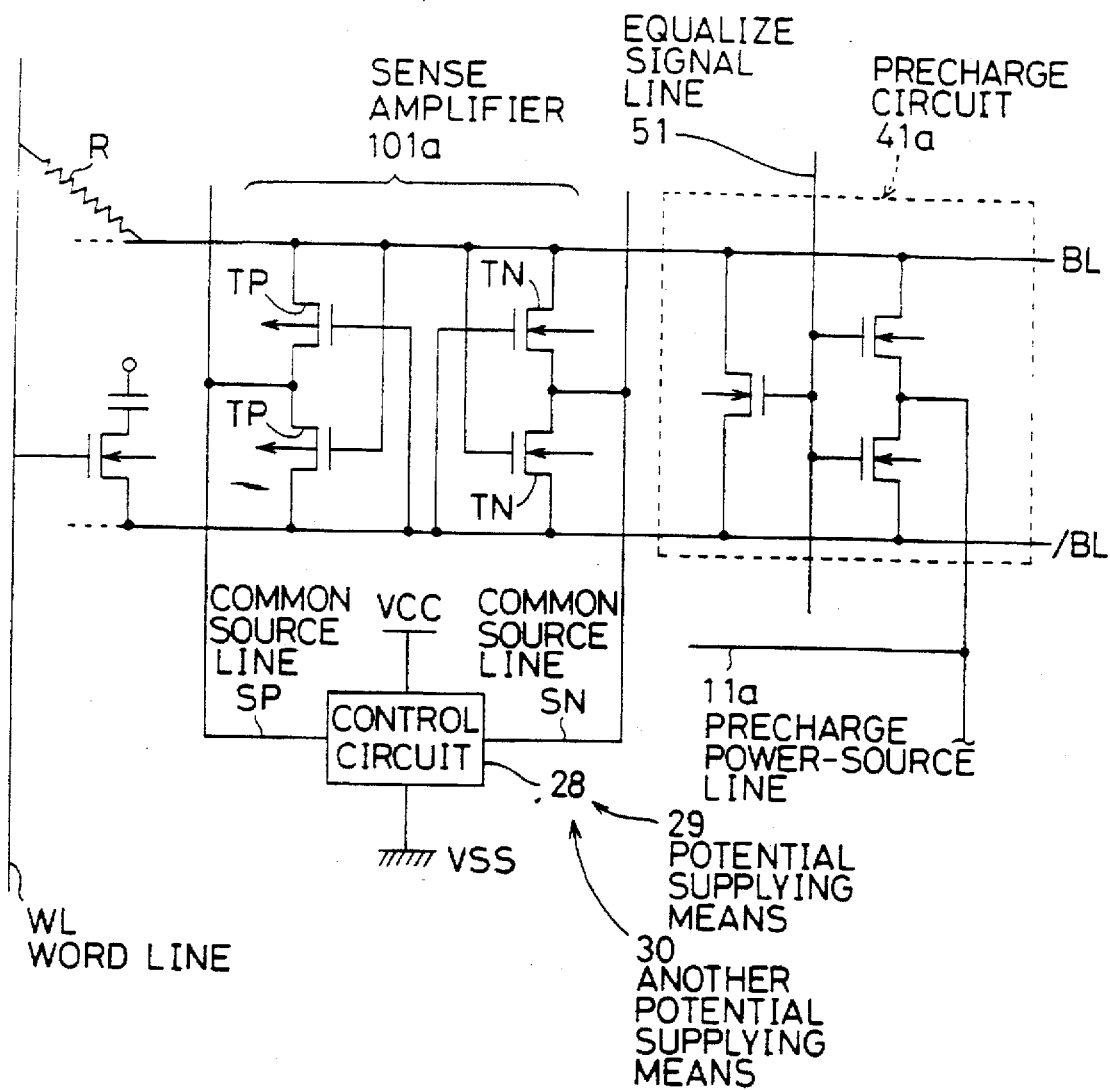
FIG. 4 is a view showing the structure of a semiconductor memory device according to a second embodiment of the present invention.

FIG. 4 shows the structure of a principal portion of a semiconductor memory device according to a second embodiment of the present invention. The present embodiment aims at reducing the standby current resulting from defective bit line and word line by preventing a malfunction of the sense amplifier. As for the basic structure including the memory cell, it is the same as that of FIGS. 2 and 3, so that the drawing and description thereof will be omitted.

In FIG. 4 is shown the sense amplifier 101a of flip-flop type which comprises two P-channel transistors (first transistors) TP for connecting a pair of bit lines BL and /BL and two N-channel transistors (second transistors) TN for connecting the pair of bit lines BL and /BL.

There is also shown: the common source line SP for the above two P-channel transistors TP; the common source line SN for the above two N-channel transistors TN; and a control circuit 28 for controlling the potentials on the above two common source lines SP and SN.

Figure 5:
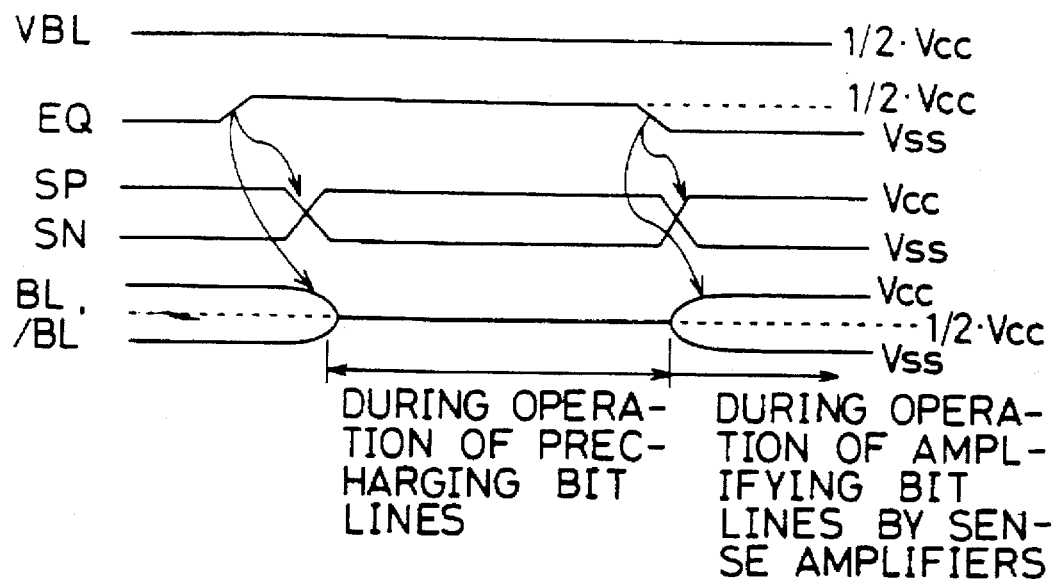
FIG. 5 is a signal waveform chart showing the precharging operation of the semiconductor memory device according to the second embodiment of the present invention.

As can be seen from the waveform chart indicating the operation of precharging the pairs of bit lines shown in FIG. 5, during the operation of precharging the pairs of bit lines BL and /BL (in other words, during the period during which the sense amplifiers are inactive, i.e., during standby during which no word line is selected), the above control circuit 28 sets the potential VSP on the common source line SP for the first transistors TP of the conductivity type (P-type) opposite to that (N-type) of the memory-cell transistor (transistor T in FIG. 2) to a value for cutting off the first transistor TP. In this case, the potential VSP is set to a value lower than the precharge potential (½·Vcc) on the bit line, such as the "L" level (ground potential VSS). The control circuit 28 constitutes a potential supplying means 29.

At the same time as the potential VSP on the common source line SP for the first transistor TP is set to the "L" level (ground potential VSS), the above control circuit 28 also sets the potential VSN on the other common source line SN to a potential for cutting off the second transistor TN. In this case, the potential VSN is set to a value higher than the precharge potential (½·VCC) on the bit line, such as the "H" level (power-source potential VCC). The control circuit 28 also constitutes another potential supplying means 30.

Accordingly, the present invention achieves the following effects.

That is, in the present embodiment, the potential VSN on the common source line SN for the sense amplifiers is set to the "H" level (VCC) during the operation of precharging the pairs of bit lines (during standby), while the potential VSP on the common source line SP for the sense amplifiers is set to the "L" level (VSS) simultaneously, thereby performing the operation of precharging the pairs of bit lines in accordance with the operational waveform shown in FIG. 5. Consequently, during standby, both the P-channel transistor TP and the N-channel transistor TN of the sense amplifier 101a are completely cut off. Accordingly, the sense amplifying operation can be halted completely, thus eliminating the standby current.

Although the potentials on the common source lines SN and SP during the operation of selecting the word line have the values obtained by inverting the values of their potentials during the precharging operation, the driving current is not significantly increased.

(Third Embodiment)

A description will be given to a third embodiment of the present invention, in which a reduction in standby current is intended by devising wiring for connecting a word line to the ground, instead of devising wiring for connecting a bit line to the ground as in the above second embodiment.

Figure 6A:
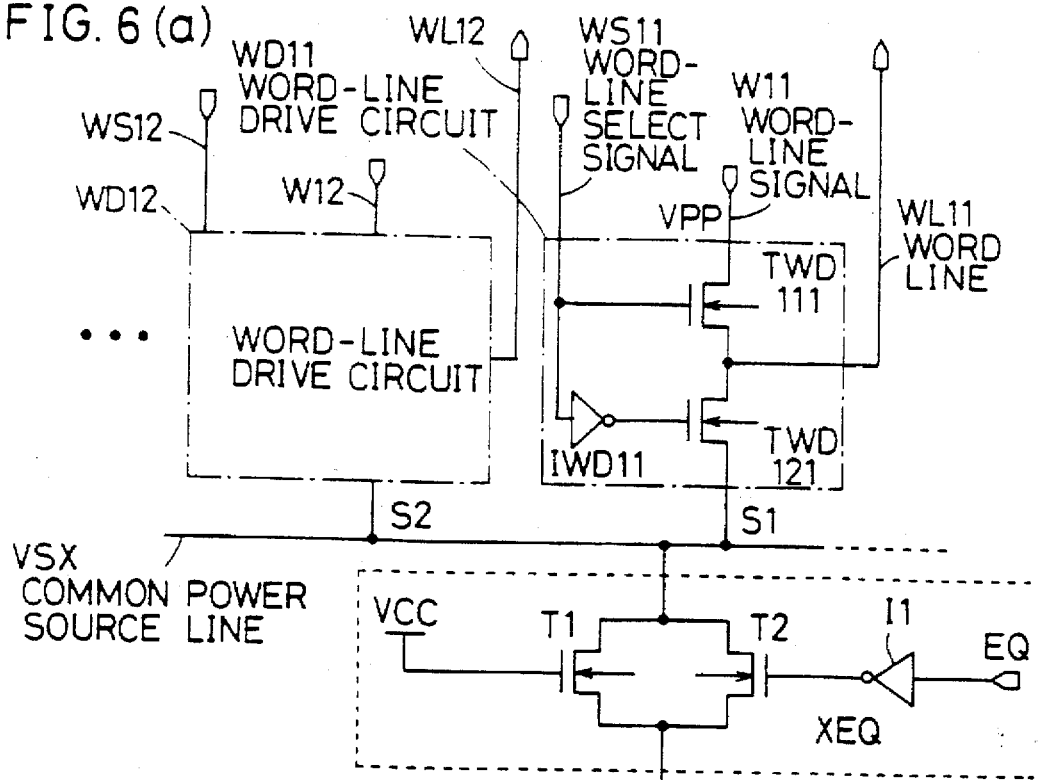
FIG. 6(a) is a view showing the structure of a principal portion of a semiconductor memory device according to a third embodiment of the present invention.

FIG. 6(a) shows a semiconductor memory device according to a third embodiment of the present invention. In the circuit diagram of FIG. 6(a) is shown the inside of only one memory cell block. In the present embodiment, only the structure for driving a word line is shown. As for the memory cell blocks obtained by dividing the memory cell array, the large number of memory cells, the numerous pairs of bit lines, the plurality of sense amplifiers, and the plurality of precharge circuits, they are the same as those of the above structure shown in FIGS. 1 to 3, so that the drawing and description thereof will be omitted.

The word lines WL11, WL12 . . . in each of the memory cell blocks (corresponding to the memory cell blocks MB1 . . . of FIG. 2, though they are not shown in FIG. 6(a)) are connected to word-line drive circuits WD11, WD12 . . . , respectively. To the word-line drive circuits WD11, WD12 . . . are inputted word-line select signal lines WS11, WS12 . . . and word-line signal lines W11, W12 . . . , respectively.

Since the word-line drive circuits WD11, WD12 . . . have the same structure, a description will be given below only to the word-line drive circuit WD11. The word-line drive circuit WD11 comprises an N-type transistor TWD111, an N-type pull-down transistor TWD121, which are connected in series, and an inverter IWD11 for inverting signals. To the transistor TWD111 is connected the word-line signal line W11. To the source of the pull-down transistor TWD121 is connected a common power-source line (artificial ground line) VSX. To the connecting point between the above transistors TWD111 and TWD121 is connected the word line WL11. The word-line select signal line WS11 is connected directly to the gate of the transistor TWD111, while it is connected to the gate of the pull-down transistor TWD121 via the inverter IWD11. The potential on the above word-line signal line W11 is used as a second potential VPP, which is different from the power-source potential VCC.

In the above word-line drive circuit WD11, if the selection of the word line WL11 is requested (if the word-line select signal WS11 is on the H level), the transistor TWD111 is turned ON so that the potential on the word-line signal line W11 is supplied onto the word line WL11. If the word-line WL11 is not selected (if the word-line select signal WS11 is on the L level), on the other hand, the pull-down transistor TWD121 is turned ON so that the word line WL11 is connected to the common power source line (artificial ground line) VSX.

Next, a description will be given to the characteristic of the present invention. The above common power source line VSX is used in common by the memory cell blocks. Between the above common power source line VSX and the ground VSS are disposed two N-type transistors T1 and T2 in parallel. To the gate of the above transistor T1 is connected the power-source potential VCC. To the gate of the transistor T2 is inputted an inverted signal XEQ which has been obtained by inverting, using an inverter I1, the equalize signal (activate signal) EQ for the precharge circuits.

Figure 6B:
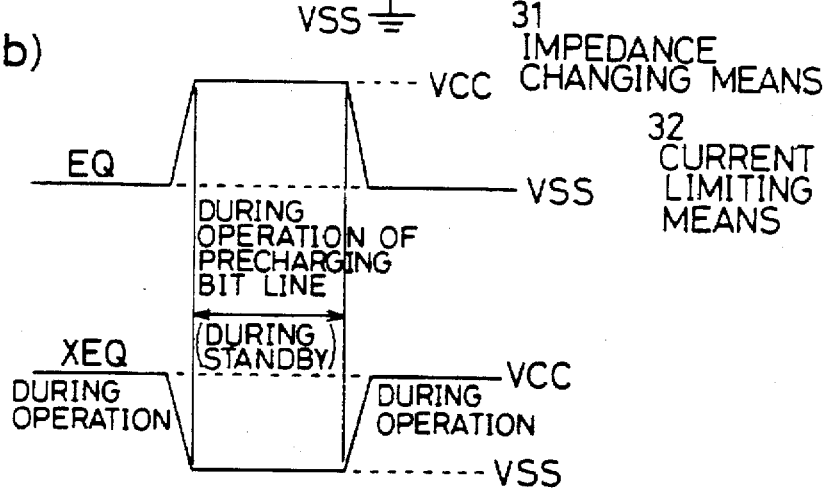
FIG. 6(b) is a view showing the waveform of a control signal.

As shown in the signal waveform of FIG. 6(b), the equalize signal EQ for the above precharge circuit is set to the "H" level (potential VCC of the power source) during the operation of precharging the pairs of bit lines (i.e., during standby), while it is set to the "L" level (ground potential VSS) at all other times. Here, the expression of "during operation" indicates the state in which any word line in a memory cell block is selected, while the expression of "during standby" indicates the state in which no word line in the memory cell block is selected.

With the above structure, the transistor T1 is constantly in the ON state, while the transistor T2 is turned ON only when the equalize signal EQ is on the "L" level, i.e., only during operation.

The above structure constitutes an impedance changing means 31 whereby the impedance between the common power source line VSX and the ground is changed to a high value by turning OFF the transistor T2 during standby. The changing means 31 constitutes a current limiting means 32 for reducing the standby current flowing from the common power-source line VSX to the ground.

Thus, the present embodiment achieves the following effects, unlike a conventional embodiment in which each of the word lines (the word lines WL11 . . . of FIG. 2. Hereinafter, a description will be given to the effects of the present embodiment using the reference numerals shown in FIGS. 2 and 3) is connected directly to the ground potential VSS via the pull-down transistor TWD121. Accordingly, in the conventional embodiment, if there is a short circuit between the bit line BL1 and the word line WL11, a leakage current is allowed to flow to the ground VSS during the operation of precharging the pairs of bit lines (during standby), resulting in unsatisfactory standby.

On the other hand, in the present embodiment, the transistor T2 is turned OFF during the operation of precharging the pairs of bit lines (during standby), while only the transistor T1 is turned ON, so that the impedance between the common power source line VSX and the ground VSS is increased. Consequently, the standby current resulting from a short circuit between a bit line and a word line can be reduced.

Although the impedance between the common power source line VSX and the ground VSS is increased and hence the potentials on the word lines WL11 . . . are raised during standby, the memory transistor is in the OFF state provided that the potentials on the word lines WL11 . . . are in the range of 0 V to the precharge potential on the bit line (½·VCC). Consequently, there occurs no leakage of information from the memory cell.

On the other hand, during the period during which any word line (e.g., WL11) is selected and the corresponding pair of bit lines are amplified by the sense amplifier (during operation), the above transistor T2 is also turned ON, so that the impedance between the common power source line VSX and the ground VSS is lowered. As a result, the potentials on the word lines that have not been selected (unselected word lines) become substantially equal to the ground potential, so that the transistor of the corresponding memory cell is surely turned OFF.

Moreover, since the present embodiment controls the transistor T2 with the equalize signal EQ for the precharge circuits in each of the sense amplifier blocks and with the inverter I1 for inverting signals, there is no need to provide an additional circuit for generating a control signal, so that an increase in the chip area of the DRAM can be prevented.

(Variation of Third Embodiment)

Figure 6C:
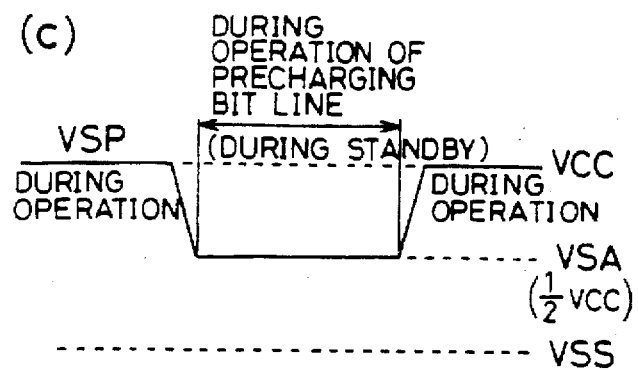
FIG. 6(c) is a view showing the waveform of another control signal.

The above third embodiment uses the equalize signal EQ for the precharge circuits so as to control the transistor T2 with the signal XEQ obtained by inverting the signal EQ. In the present variation, however, the potential VSP on the common source line SP connected for the sense amplifiers shown in FIG. 6(c) is inputted as it is to the gate of the transistor T2 shown in FIG. 6(a). The structure of the present variation is the same as the structure of FIG. 6(a), except that a different signal is used to control the above transistor T2.

In addition to the effects achieved by the above third embodiment, the present variation achieves the following new effect.

The potential VSP on the common source line SP for the sense amplifiers shifts, on the rising edge of the equalize signal EQ for the precharge circuits, from the "H" level (e.g., the power-source potential VCC) to the reference potential VSA (e.g., the precharge reference potential ½·VCC), so that each of the sense amplifiers is inactivated. Subsequently, the potential VSP on the common source line SP for the sense amplifiers shifts, on the falling edge of the above equalize signal EQ for the precharge circuits, from the above reference potential VSA to the above "H" level (VCC), so that each of the sense amplifiers is activated (hereinafter, the signal will be referred to as a sense amplifier activate signal SPA).

Strictly speaking, the timing for initiating the connection of the unselected word lines to the ground voltage with a low impedance is the timing for the amplitude of the bit lines to start changing, i.e., the timing for the sense amplifiers to initiate operation, so that until then, it is not necessary to connect the unselected word lines to the ground potential with a low impedance. Compared with the above third embodiment in which the impedance is controlled with the inverted signal XEQ of the equalize signal EQ for the precharge circuits, the period during which the above unselected word lines have a low impedance is shortened in the present variation, since it uses the sense amplifier activate signal SPA which starts changing after about 10 ns had passed since the above equalize signal EQ was activated. Therefore, the period during which a large current is allowed to flow between the bit line and the word line can further be reduced.

(Fourth Embodiment)

Below, a description will be given to a fourth embodiment of the present invention.

Figure 7A:
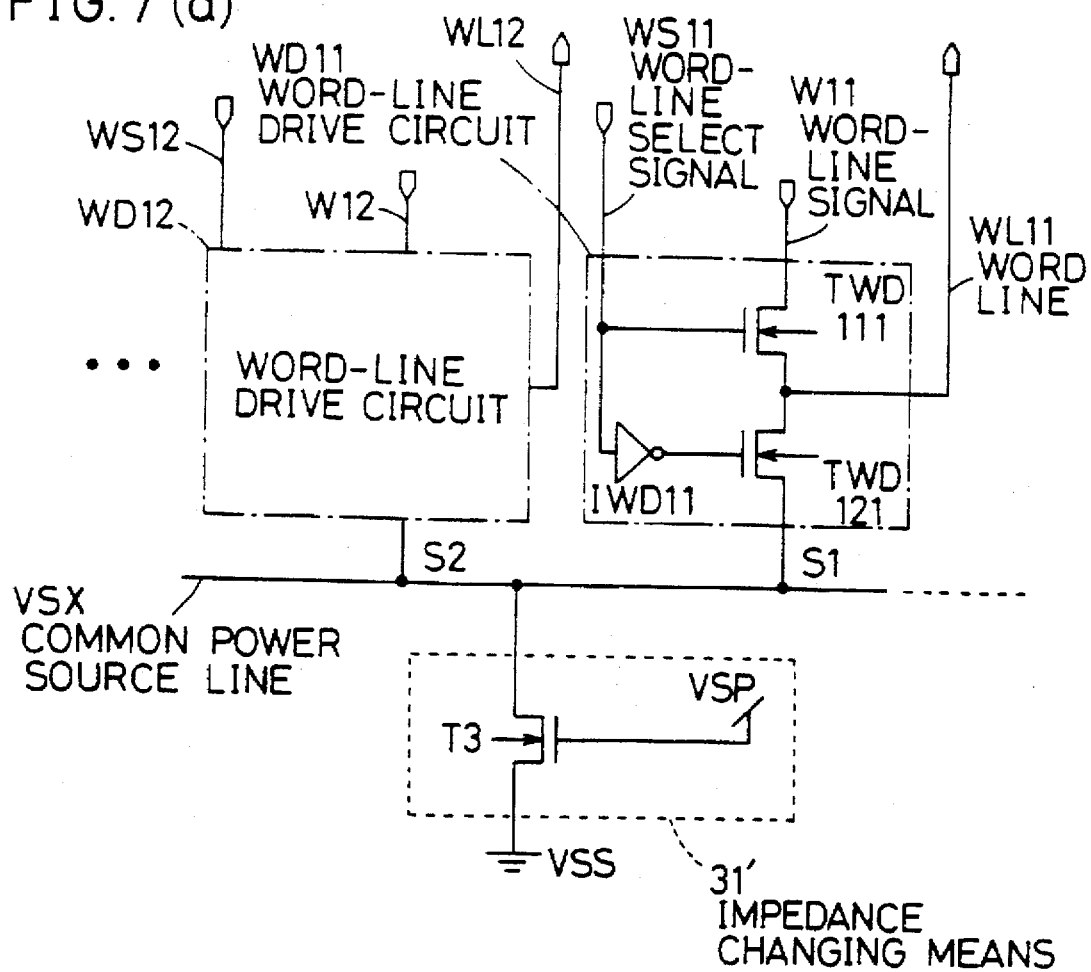
FIG. 7(a) is a view showing the structure of a principal portion of a semiconductor memory device according to a fourth embodiment of the present invention.

FIG. 7(a) is a circuit diagram showing a semiconductor memory device of the fourth embodiment of the present invention.

The present embodiment is the same as the third embodiment shown in FIG. 6(a) in that the respective sources S1, S2 . . . of the pull-down transistors TWD121 . . . in the respective word-line drive circuits WD11, WD12 . . . are connected in common to the common power source line VSX.

The semiconductor memory device of the fourth embodiment of FIG. 7(a) is different from that of the third embodiment of FIG. 6(a) in that an N-channel transistor T3 is provided between the ground VSS and the common power source line VSX so that the potential VSP on the common source line SP for the P-channel transistors of the sense amplifiers is inputted to the gate of the above transistor T3 (hereinafter the signal will be referred to as a P-sense-amp control signal).

Figure 7B:
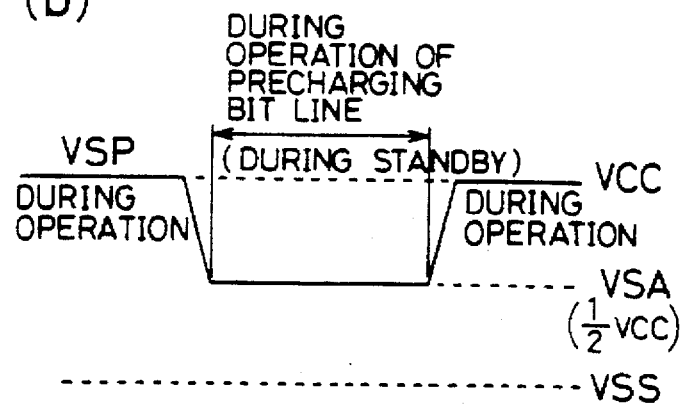
FIG. 7(b) is a view showing the waveform of a control signal.

As shown in FIG. 7(b), the above P-sense-amp control signal VSP is set to the reference potential VSA (e.g., the precharge reference potential ½·VCC for each pair of bit lines) during the operation of precharging each pair of bit lines, while it is set to the "H" level (e.g., the potential VCC in the power source) during the operation of amplifying the pair of bit lines by the above sense amplifier. The above structure constitutes an impedance changing means 31'.

Thus, according to the present embodiment, during the operation of precharging each pair of bit lines (during standby), the transistor T3 has a high impedance since the gate potential thereof is equal to the above reference potential VSA (½·VCC), so that the impedance between the common power-source line VSX and the ground VSS becomes high, thereby reducing the standby current resulting from a bit-line/word-line short circuit. On the other hand, during the operation of amplifying the pair of bit lines by the above sense amplifier (during operation), the above transistor T3 has a low impedance since the gate potential thereof is set to the "H" level (VCC), so that the impedance between the common power source VSX and the ground VSS is lowered, thereby connecting the unselected word lines to the ground VSS with a low impedance.

Furthermore, in the present embodiment also, the transistor T3 is controlled by the potential VSP on the common source line SP for the P-channel transistors of the sense amplifiers, so that it is no more necessary to provide an additional circuit for generating a control signal, thus preventing an increase in the chip area of the DRAM.

(Fifth Embodiment)

Below, a description will be given to a fifth embodiment of the present invention.

Figure 8A:
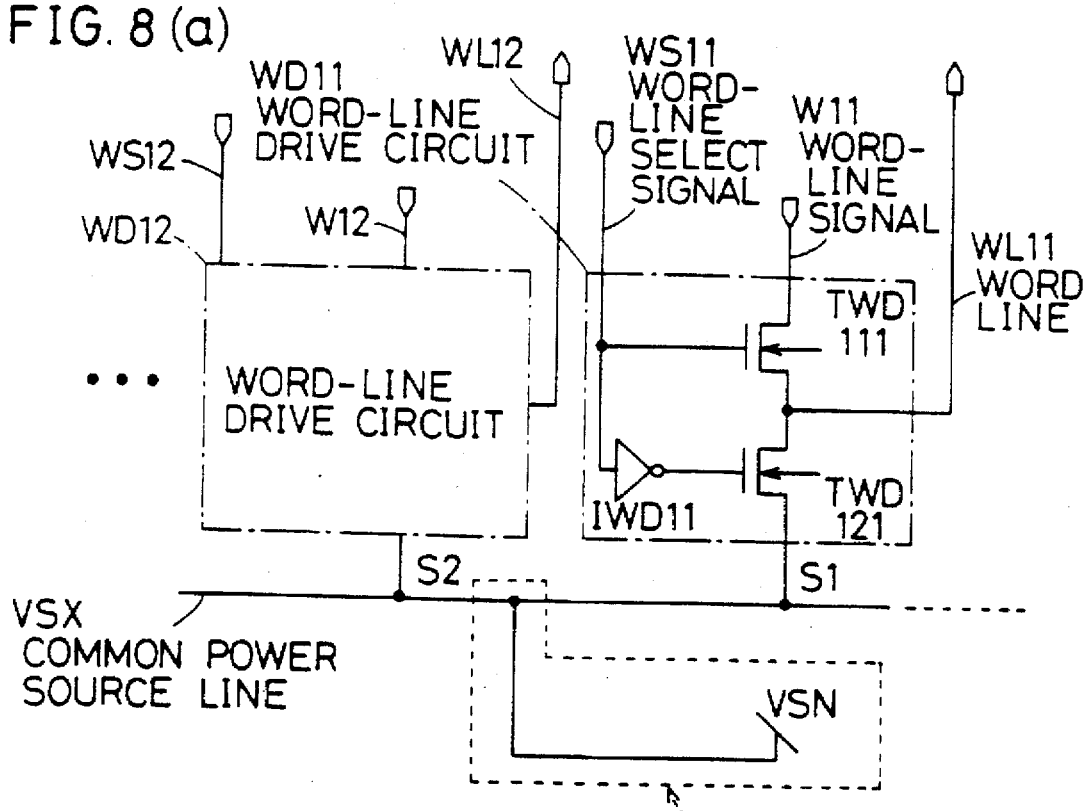
FIG. 8(a) is a view showing the structure of a principal portion of a semiconductor memory device according to a fifth embodiment of the present invention.

FIG. 8(a) is a circuit diagram showing a semiconductor memory device according to the fifth embodiment of the present invention.

The present embodiment is the same as the above third embodiment of FIG. 6(a), in that the sources S1, S2 ... of the respective word-line drive circuits WD11, WD12, ... are connected in common to the common power source line VSX in each of the memory cell blocks.

The semiconductor memory device of the present embodiment is different from the third embodiment of FIG. 6 in that the common power source line VSX is connected to the potential VSN (hereinafter referred to as an N-sense-amp control signal) on the common source line SN for the sense amplifiers.

Figure 8B:
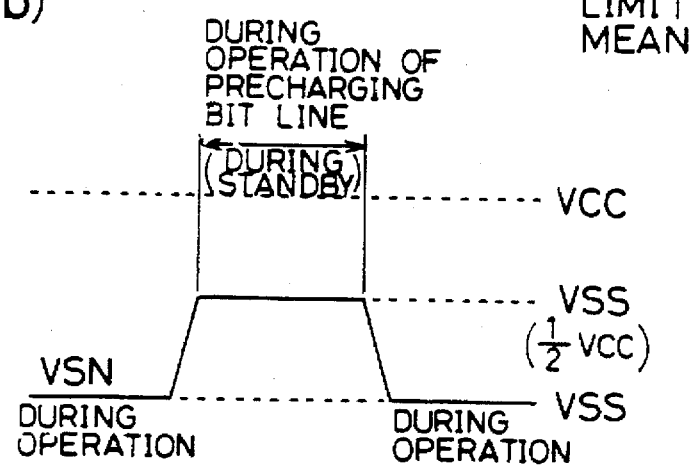
FIG. 8(b) is a view showing the waveform of a control signal.

As shown in FIG. 8(b), the above N-sense-amp control signal VSN is set to the reference potential VSA (e.g., the precharge reference potential ½·VCC on each pair of bit lines) during the operation of precharging each pair of bit lines (during standby), while it is set to the "L" level (e.g., the power-source potential VSS) during the operation of amplifying the pair of bit lines by the sense amplifier (during operation).

The above structure constitutes a potential changing means 51 which changes the potential on the common power source line VSX during the operation of precharging each pair of bit lines (during standby), i.e., when the word lines WL11, WL12 ... are connected to the common power source line VSX via the pull-down transistors TWD121 ... that have been turned ON, so that it becomes equal to the precharge potential (½·VCC) on the pair of bit lines as a reference potential VSA (½·VCC). The potential changing means constitutes a current limiting means 32' for reducing the standby current by reducing the potential difference between the short-circuited bit line and word line, preferably to zero.

Thus, in the present embodiment, each of the word-line select signal lines WS11, WS12 ... shifts to the "L" level during the operation of precharging each pair of bit lines (during standby), so that the pull-down transistors TWD 121 ... of the respective word-line drive circuits are turned ON, thereby connecting the word lines WL11, WL12 ... to the common power source line VSX. At this time, since the common power source line VSX is at the reference potential VSA (½·VCC), which is equal to the potential on the bit line short-circuited with the word line, the standby current resulting from the bit-line/word-line short circuit can be reduced.

On the other hand, during the sense amplifying operation (during operation), the common power source line VSX is set at the ground potential VSS, so that the unselected word lines can be pulled down to the ground potential VSS with a low impedance.

Furthermore, according to the present invention, the common source line for the sense amplifiers in each of the sense amplifier blocks is connected as it is to the common power source line VSX, so that it is no more necessary to provide an additional circuit for generating a control signal, thus preventing an increase in the chip area of the DRAM.

(Sixth Embodiment)

Below, a description will be given to a sixth embodiment of the present invention.

Figure 9:
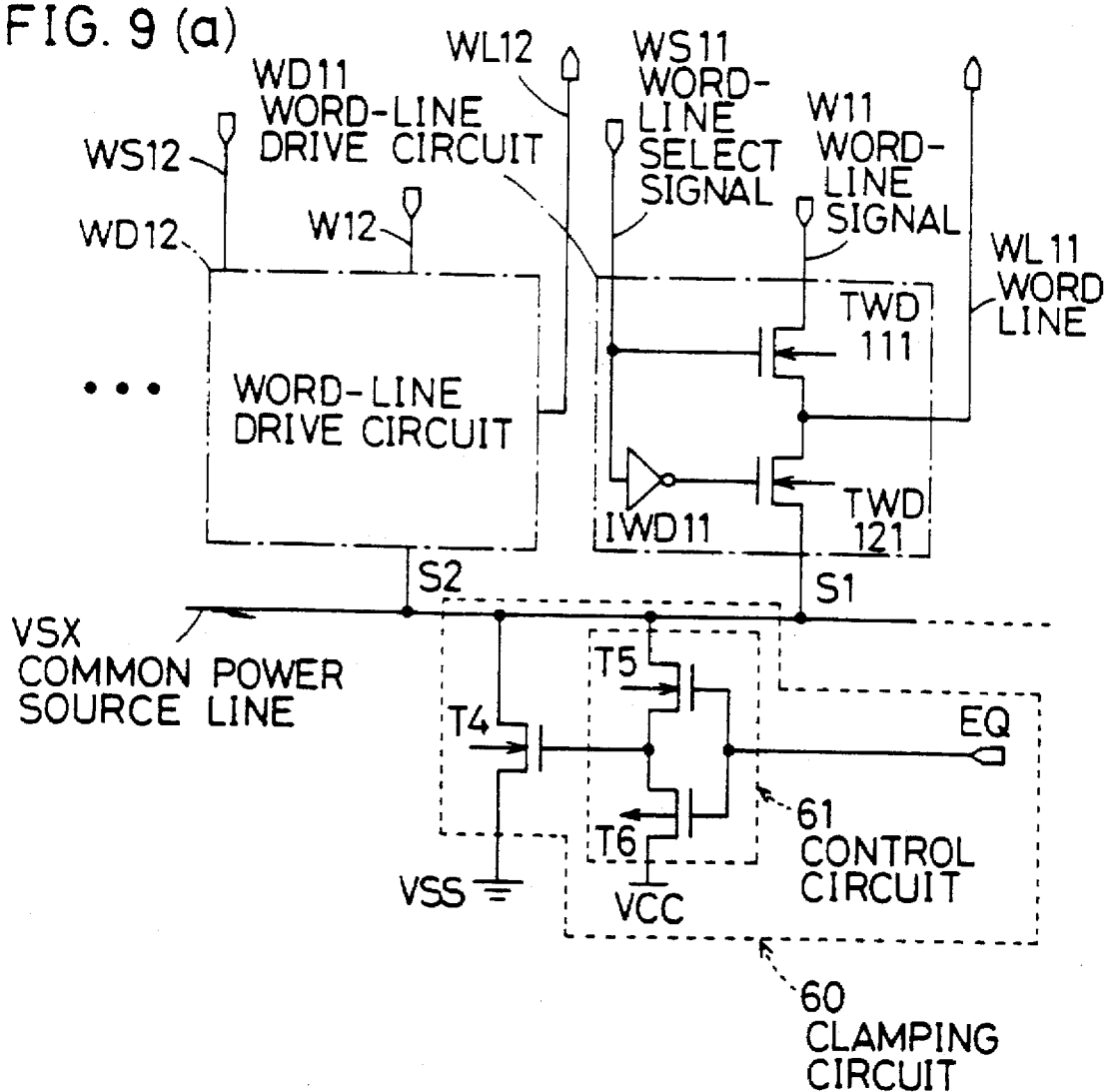
FIG. 9(a) is a view showing the structure of a principal portion of a semiconductor memory device according to a sixth embodiment of the present invention.
FIG. 9(b) is a view showing the waveform of a control signal.
Figure 9:
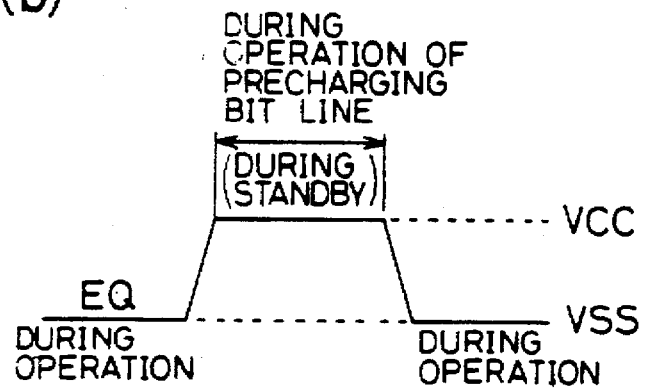

FIG. 9(a) is a circuit diagram showing a semiconductor memory device according to the sixth embodiment of the present invention.

The present embodiment is the same as the above third embodiment of FIG. 6(a) in that the sources S1, S2 ... of the respective word-line drive circuits WD11, WD12 ... are connected in common to the common power source line VSX in each of the memory cell blocks.

The semiconductor memory device according to the present embodiment is different from the third embodiment of FIG. 6 in that, as shown in FIG. 9(a), an N-type MOS transistor T4 is provided between the common power source line VSX and the ground VSS and that a control circuit 61 consisting of an N-type MOS transistor T5 and a P-type MOS transistor T6 connected in series is provided. The N-type MOS transistor T5 and P-type MOS transistor T6 in series are connected in parallel to the above transistor T4. The drains of the above transistors T5 and T6 are connected to the gate of the above transistor T4. The source of the transistor T5 is connected to the common power source line VSX. The source of the transistor T6 is connected to the power source VCC. The transistors T5 and T6 connected in series are also controlled by the activate signal (equalize signal) EQ for the precharge circuits shown in FIG. 9(b). Consequently, in the control circuit 61, the transistor T5 is turned ON during the operation of precharging the bit lines (during standby), so that the potential on the common power source line VSX is supplied to the gate of the transistor T4. During operation, on the other hand, the transistor T6 is turned ON so that the power-source potential VCC is supplied to the gate of the transistor T4. The transistor T4 has a specified threshold voltage VT4.

The above structure constitutes a clamping circuit 60 whereby, when the equalize signal EQ is at the "H" level (power-source potential VCC) (during standby), if the potential on the common power source line VSX surpasses the threshold voltage VT4 of the transistor T4, the transistor T4 is turned ON and a current is allowed to flow from the common power source line VSX to the ground VSS via the transistor T4, thereby clamping the potential on the power-source line VSX at the threshold voltage VT4 of the transistor T4. The clamping circuit 60 constitutes a potential changing means 51' for changing the potential on the common power source line VSX.

During the operation of precharging the bits lines (during standby), the pull-down transistors TWD121 ... of the respective word-line drive circuits WD11, WD12 ... are turned ON, so that the word lines WL11, WL12 ... are connected to the common power source line VSX. In this case, the transistor T5 of the control circuit 61 is turned ON and therefore the potential on the common power source line VSX is applied to the gate of the transistor T4, so that the potential on the common power source line VSX is clamped at the threshold voltage VT4 of the transistor T4. Consequently, even when a short circuit occurs between a bit line and a word line, there can be reduced the standby current flowing to the ground via the short-circuited bit line and word line.

On the other hand, during the operation of selecting a word line (during operation), the pull-down transistors of the respective unselected-word-line drive circuits are turned ON, so that each of the unselected word lines is connected to the common power source line VSX. At this time, since the N-type MOS transistor T5 is turned OFF and the P-type MOS transistor T6 is turned ON in the control circuit 61, the gate of the N-type MOS transistor T4 is connected to the power-source potential VCC via the transistor T6. As a result, the N-type MOS transistor T4 is constantly in the ON state with a low impedance, so that the impedance between the common power source line VSX and the ground VSS is lowered, thereby connecting the unselected word lines to the ground with a low impedance.

(Seventh Embodiment)

Below, a description will be given to a seventh embodiment of the present invention.

Figure 10:
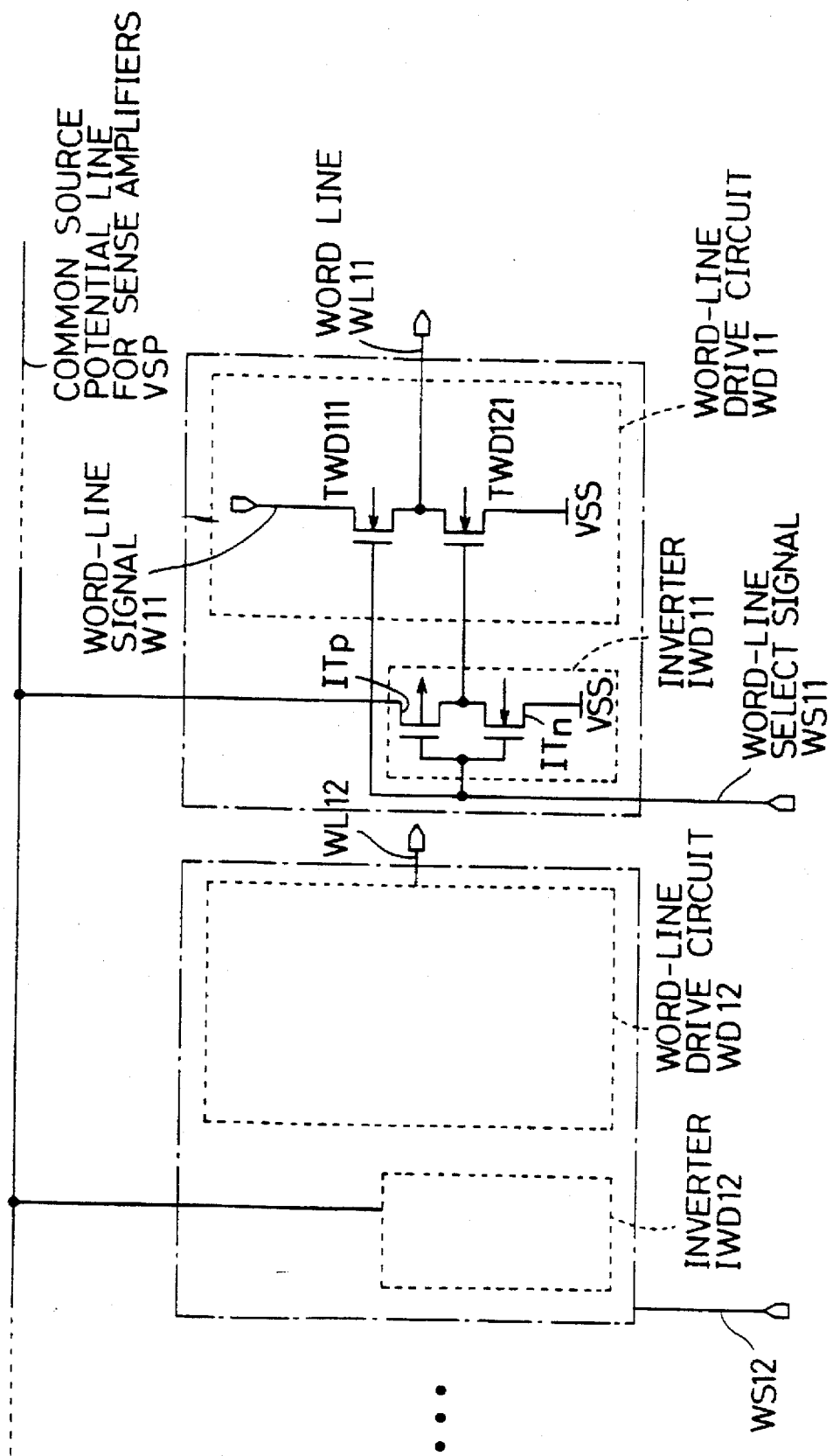
FIG. 10 is a view showing the structure of a principal portion of a semiconductor memory device according to a seventh embodiment of the present invention.
Figure 11:
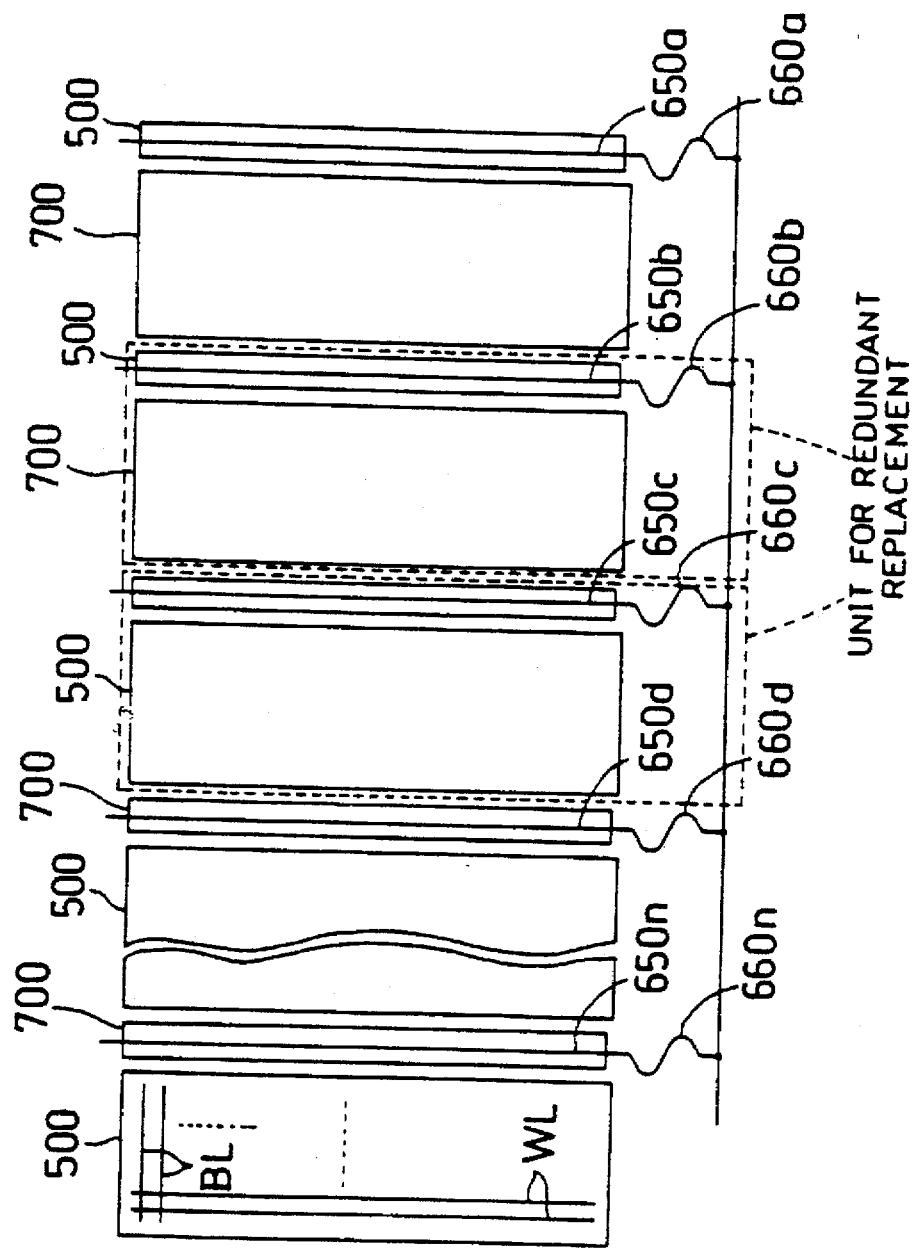
FIG. 11 is a view showing the overall structure of a conventional semiconductor memory device.
Figure 12:
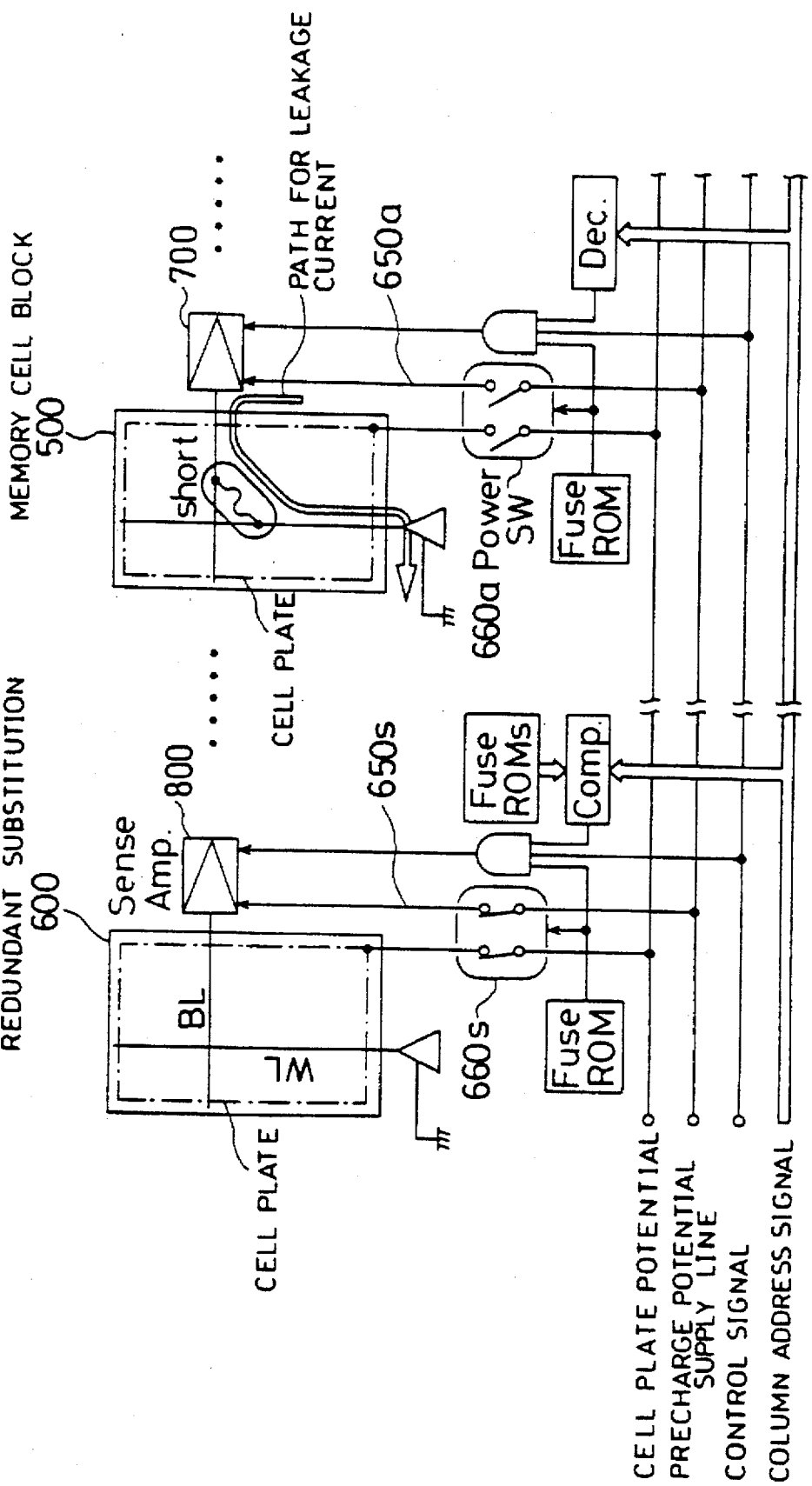
FIG. 12 is a view showing the structure of a principal portion of the conventional semiconductor memory device.
Figure 13:
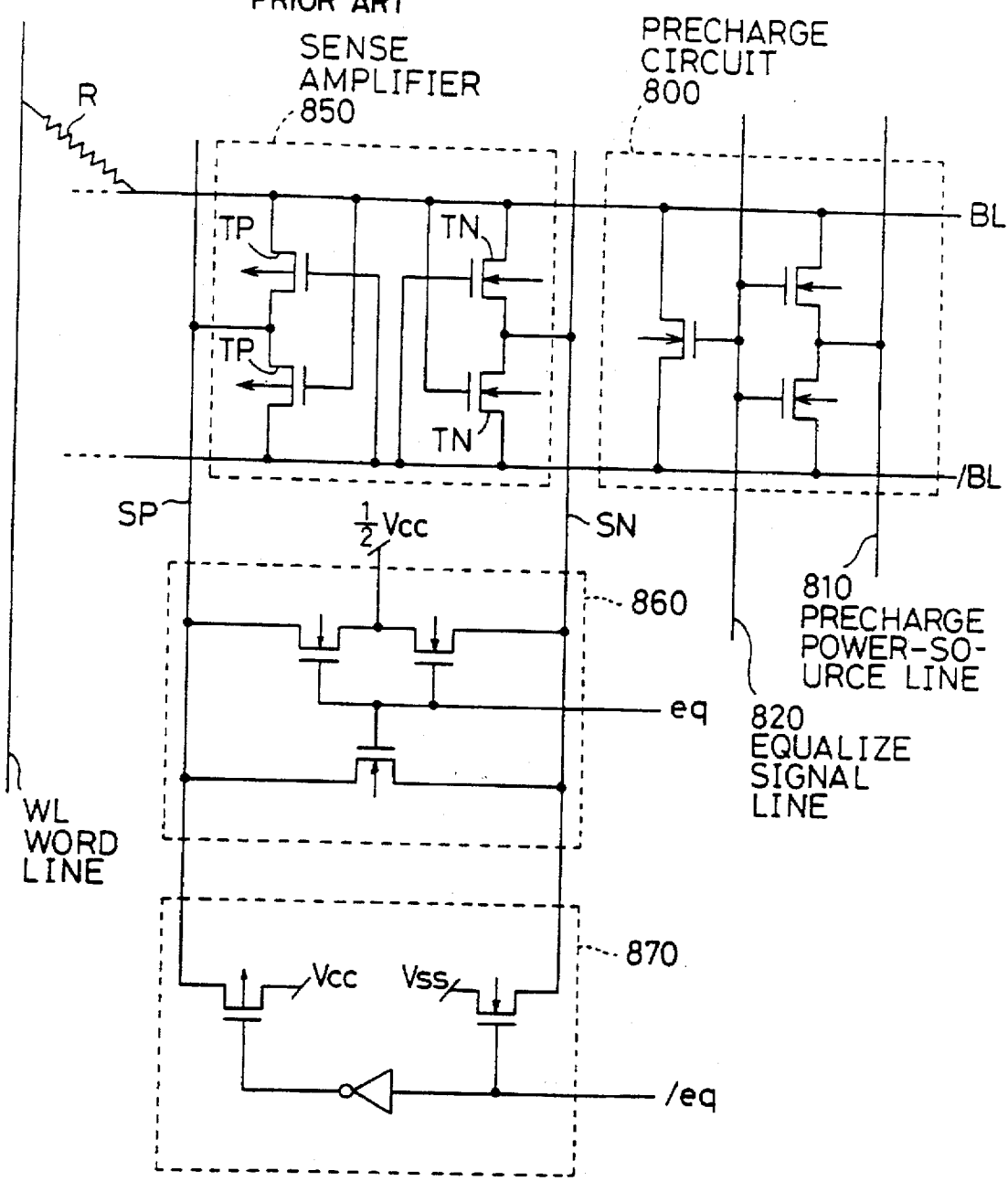
FIG. 13 is a view showing the structure of another principal portion of the conventional semiconductor memory device.
Figure 14:
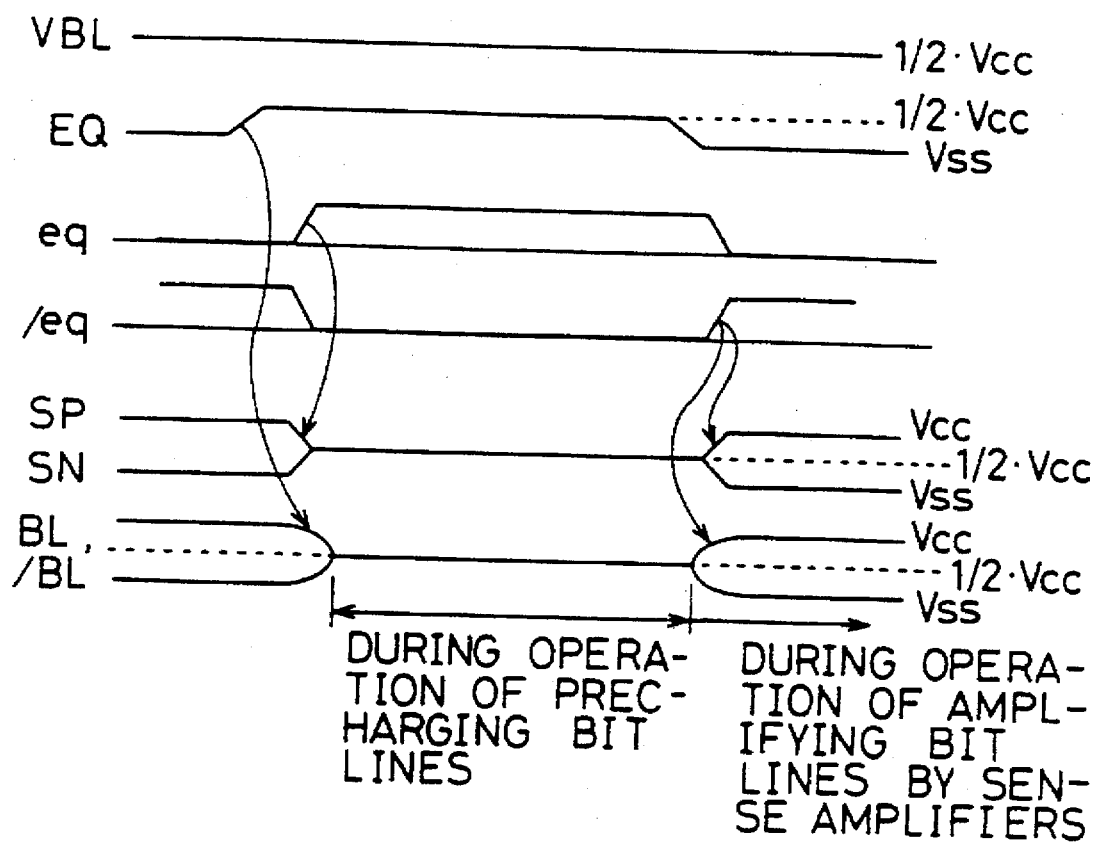
FIG. 14 is a signal waveform chart showing the precharging operation of the conventional embodiment.

FIG. 10 is a circuit diagram showing a semiconductor memory device according to the seventh embodiment of the present invention.

In the drawing are shown: the word lines WL11 and WL12; the word-line drive circuits WD11 and WD12; and inverters (logic circuits) IWD11 and IWD12. Since the above word-line drive circuits have the same structure and the above inverters have the same structure, descriptions will be given only to the internal structure of the word-line drive circuit WD11 and to the internal structure of the inverter IWD11.

The word line WL11 is connected to the word-line signal line W11 via the N-type transistor TWD111 of the word-line drive circuit WD11, while it is connected to the ground VSS via the N-type pull-down transistor TWD121 of the word-line drive circuit WD11. To the gate electrode of the transistor TWD111 is inputted as it is a word-line select signal WS11. The word-line select signal WS11 is set to the "H" level when the selection of its word line is requested, while it is set to the "L" level when the selection of its word line is not requested.

The above inverter IWD11 is a control circuit for controlling the pull-down transistor TWD121, which consists of a P-type transistor ITp and an N-type transistor ITn connected in series. The power source of the above inverter IWD11 is composed of the potential VSP on the common source line SP for the P-channel transistors of the sense amplifiers. The common source line SP is connected to the source of the P-type transistor ITp. As shown in FIG. 7(b), the potential VSP on the common source line SP for the above sense amplifiers is set at the intermediate potential VSA (e.g., ½·VCC) during the precharging operation (during standby during which no word line is selected), while it is set at the power-source potential VCC during operation during which any word line is selected. The source of the N-type transistor ITn is connected to the ground VSS. To the drains of the transistors ITp and ITn is connected the gate of the pull-down transistor TWD121. To the gates of the transistors ITp and ITn is inputted the word-line select signal WS11.

Thus, in the inverter IWD11, the N-type transistor ITn is turned ON during operation during which the word line thereof is selected, i.e., if the word-line select signal WS11 thereof is at the "H" level, so that the ground potential VSS is outputted to the gate of the N-type pull-down transistor TWD121. Conversely, the P-type transistor ITp of the inverter IWD11 is turned ON during operation during which the word line thereof is not selected, i.e., if the word-line select signal WS11 is at the "L" level, so that the potential VSP on the common source line SP for the sense amplifiers is outputted to the gate of the pull-down transistor TWD121.

Accordingly, during operation during which the word line of the inverter IWD11 is selected, the pull-down transistor TWD121 is completely turned OFF, so that the word line WL11 and the ground VSS is completely cut off, while the transistor TWD111 is turned ON, thereby outputting the word-line signal W11 onto the word line WL11.

Conversely, if the word line of the inverter IWD11 is not selected, the transistor TWD111 is turned OFF, while the potential VSP on the common source line SP for the sense amplifiers is outputted to the gate of the pull-down transistor TWD121. During operation during which another word line is selected, since the above potential VSP on the common source line SP for the sense amplifiers becomes equal to the power-source potential VCC, the N-type pull-down transistor TWD121 is completely turned ON, so that the word line WL11 of the inverter circuli IWD11 is surely set at the ground potential VSS. On the other hand, during standby during which no word line is selected, since the above potential VSP on the common source line SP for the sense amplifiers becomes equal to the intermediate potential VSA (½·VCC), the N-type pull-down transistor TWD121 has a high impedance, so that the standby current flowing from the pull-down transistor TWD121 to the ground VSS can be reduced.

Thus, using the potential VSP on the common source line SP for the sense amplifiers, the impedance between the word line and the ground potential VSS can be changed between a value during standby and another value during operation during which another word line is selected. Accordingly, the word line is connected to the ground with a high impedance during the precharging operation (during standby), thereby reducing the standby current. During operation during which another word line is selected, on the other hand, the word line of the inverter IWD11 can be connected to the ground with a low impedance, so that the same effect achieved in the above third embodiment of the present invention can be achieved.

It will easily be appreciated that the seventh embodiment of the present invention is not only applicable to the inverter IWD11 for inverting signals, but also to a logic circuit such as a NAND circuit or NOR circuit.

We claim:

1. A semiconductor memory device comprising:
   a plurality of memory cells, each consisting of a capacitor and a transistor;
   a plurality of word lines for individually controlling the transistors of said memory cells;

plural pairs of bit lines onto which information accumulated in the capacitors of said memory cells is read individually;

a plurality of sense amplifiers for individually amplifying the information read onto the pairs of bit lines;

a plurality of pull-down transistors which are equal in number to said word lines, said pull-down transistors connecting, if the corresponding word lines are not selected, the corresponding word lines to the ground; and precharge circuits for precharging, during standby during which no word line is selected, said pairs of bit lines to a specified potential, said semiconductor memory device further comprising a current limiting means for reducing, during standby, a current flowing from each of the word lines to the ground via the pull-down transistor.

2. A semiconductor memory device according to claim 1, wherein the current limiting means consists of:

a common power source line to which the sources of the respective pull-down transistors are connected; and an impedance changing means disposed in a path connecting said common power source line to the ground so as to change the impedance of the path between a value during standby and another value during operation during which any word line is selected, the value during standby being set higher than the value during operation.

3. A semiconductor memory device according to claim 2, wherein the impedance changing means comprises a transistor disposed in the path connecting the common power source line to the ground, said transistor is controlled based on an activate signal for the precharge circuits, said activate signal for the precharge circuits has different potentials during standby and during operation, and the impedance of said transistor during standby is higher than that of said transistor during operation.

4. A semiconductor memory device according to claim 2, wherein the impedance changing means comprises a transistor disposed in the path connecting the common power source line to the ground, said transistor is controlled by an activate signal for the sense amplifiers, said activate signal for the sense amplifiers has different potentials during standby and during operation, and the impedance of said transistor during standby is higher than that of said transistor during operation.

5. A semiconductor memory device according to claim 4, wherein the transistor is an N-type transistor, the activate signal for the sense amplifiers is at a potential equal to the potential on the common source line for P-type transistors constituting the sense amplifiers, and said common source line for the P-type transistors is set at a potential corresponding to half the power-source potential of the semiconductor memory device during standby, while it is set at a potential equal to said power-source potential.

6. A semiconductor memory device according to claim 1, wherein the current limiting means consists of:

a common power source line to which the sources of the respective pull-down transistors are connected; and a potential changing means for changing the potential on said common power source line between a value during standby and another value during operation during which any word line is selected, the value during standby being set higher than the value during operation.

7. A semiconductor memory device according to claim 6, wherein the potential changing means sets, during standby, the potential on the common power source line to a value equal to that of the precharge potential on the bit line.

8. A semiconductor memory device according to claim 7, wherein the potential changing means is a common source line for driving N-type transistors constituting the sense amplifiers and said common source line is connected to the common power source line so that it is set at the precharge potential on the bit line during standby and set at the ground potential during operation.

9. A semiconductor memory device according to claim 6, wherein the potential changing means is composed of a clamping circuit for clamping, during standby, the potential on the common power source line at a value higher than the value during operation.

10. A semiconductor memory device according to claim 9, wherein the clamping circuit consists of:

an N-type transistor which is disposed between the common power source line and the ground and which has a specified threshold voltage; and a control circuit for supplying, during standby, the potential on said common power source line to the gate electrode of said transistor and supplying, during operation, the power-source potential of the semiconductor memory device to the gate electrode of said transistor.

11. A semiconductor memory device according to claim 10, wherein the control circuit comprises an N-type transistor and a P-type transistor connected in series, the source of said N-type transistor is connected to the common power source line and the source of said P-type transistor is connected to the power source of the semiconductor memory device, the drains of said two transistors are connected in common to the gate of the N-type transistor having the specified threshold voltage, the gates of said two transistors are supplied in common with an activate signal for the precharge circuits, said activate signal is set at the power-source potential of the semiconductor memory device during standby, while it is set at the ground potential during operation, and the potential on the common power source line is clamped, during standby, at the specified threshold voltage of the N-type transistor connected in parallel to said control circuit.

12. A semiconductor memory device according to claim 2, wherein the impedance changing means consists of:

a pull-down transistor; and a control circuit for controlling said pull-down transistor and said control circuit is for cutting off said pull-down transistor when the selection of the corresponding word line is requested, controlling said pull-down transistor so that it has a low impedance when the selection of another word line is requested, and controlling said pull-down transistor so that it has a high impedance during standby.

13. A semiconductor memory device according to claim 12, wherein the pull-down transistor is composed of an N-type transistor, the control circuit is composed of a logic circuit, to said logic circuit is inputted a word-line select signal for requesting the selection of the corresponding word line and is connected, as a power source, a common source line for P-type transistors constituting the sense amplifiers, said common source line for the sense amplifiers is set at a high potential during operation during which any word line is selected and at a low potential during standby, and said logic circuit is for supplying, when said word-line select signal has been inputted thereto, the ground potential to the gate electrode of said pull-down transistor and supplying, when said word-line select signal has not been inputted thereto, the potential on said common source line for the sense amplifiers to the gate electrode of said pull-down transistor.

14. A semiconductor memory device according to claim 13, wherein the logic circuit is composed of an inverter, said inverter is composed of a P-type transistor and an N-type transistor connected in series, to the source electrode of said P-type transistor is connected the common source line for the sense amplifiers, to the source electrode of said N-type transistor is connected the power source of the semiconductor memory device, to the gate electrodes of said two transistors is inputted the word-line select signal, and the drains of said two transistors are connected in common to the gate electrode of the pull-down transistor.

* * * * *